(12) United States Patent
Harada et al.

(10) Patent No.: US 8,337,726 B2
(45) Date of Patent: Dec. 25, 2012

(54) FINE PARTICLE DISPERSION AND METHOD FOR PRODUCING FINE PARTICLE DISPERSION

(75) Inventors: Takuya Harada, Tokyo (JP); Hidemichi Fujiwara, Tokyo (JP); Kazuhiro Takashiba, Tokyo (JP); Nobumitsu Yamanaka, Tokyo (JP); Yusuke Yamada, Tokyo (JP); Hideo Nishikubo, Tokyo (JP); Takashi Unno, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 575 days.

(21) Appl. No.: 12/309,738

(22) PCT Filed: Jul. 25, 2007

(86) PCT No.: PCT/JP2007/064577
§ 371 (c)(1),
(2), (4) Date: Oct. 29, 2009

(87) PCT Pub. No.: WO2008/013199
PCT Pub. Date: Jan. 31, 2008

(65) Prior Publication Data
US 2010/0113647 A1    May 6, 2010

(30) Foreign Application Priority Data

Jul. 28, 2006 (JP) ................. 2006-205984
Nov. 9, 2006 (JP) ................. 2006-304360
Nov. 9, 2006 (JP) ................. 2006-304361
Mar. 22, 2007 (JP) ................. 2007-074950
Jun. 26, 2007 (JP) ................. 2007-167286

(51) Int. Cl.
*H01B 1/24* (2006.01)
*H01B 1/02* (2006.01)

(52) U.S. Cl. ..... 252/513; 252/500; 252/511; 106/160.1; 106/204.01; 257/773; 523/205; 524/439; 977/773

(58) Field of Classification Search ............... 250/500, 250/511, 513; 257/773; 106/160.1, 204.01; 523/205; 524/439; 977/773
See application file for complete search history.

(56) References Cited

U.S. PATENT DOCUMENTS

| | | | |
|---|---|---|---|
| 2006/0163744 A1* | 7/2006 | Vanheusden et al. | 257/773 |
| 2006/0211802 A1* | 9/2006 | Asgari | 524/439 |
| 2007/0096066 A1* | 5/2007 | Yoshida et al. | 252/511 |

FOREIGN PATENT DOCUMENTS

| | | |
|---|---|---|
| JP | 2004-277627 | 10/2004 |
| JP | 2004-323568 | 11/2004 |
| JP | 2005-081501 | 3/2005 |
| JP | 2005-330552 | 12/2005 |
| WO | WO 2004/113441 | * 12/2004 |

* cited by examiner

*Primary Examiner* — Khanh Tuan Nguyen
(74) *Attorney, Agent, or Firm* — Kubotera & Associates, LLC

(57) ABSTRACT

In a fine particle dispersion, a fine particle (P) is dispersed in a mixed organic solvent. The fine particle (P) is formed of one type or not less than two types of a metal, an alloy, and/or a metallic compound, and has a mean particle diameter between 1 nm and 150 nm for primary particles thereof. Further, the fine particle (P) has a surface at least a part thereof coated with a polymer dispersing agent (D).

6 Claims, No Drawings

FINE PARTICLE DISPERSION AND METHOD FOR PRODUCING FINE PARTICLE DISPERSION

TECHNICAL FIELD

The present invention relates to a fine particle dispersion and a method for producing the fine particle dispersion, wherein a fine particle comprised of one type or not less than two types of a metal, an alloy, and/or a metallic compound, is dispersed in a predetermined mixed organic solvent, and which is superior in dispersibility, storage stability, or the like.

Here, entire contents of (1) Japanese Patent Application No. 2006-205984 patent applied on the twenty-eighth of July, 2006, (2) Japanese Patent Application No. 2006-304360 patent applied on the ninth of November, 2006, (3) Japanese Patent Application No. 2006-304361 patent applied on the ninth of November, 2006, (4) Japanese Patent Application No. 2007-074950 patent applied on the twenty-second of March, 2007, and (5) Japanese Patent Application No. 2007-167286 patent applied on the twenty-sixth of June, 2007, that are basic applications of the present application, are expressly incorporated in the present application as reference documents to be a part of the present specification.

BACKGROUND ART

It is known that a fine particle of metal (particle diameter of not larger than 1 μm) has a variety of specific characteristics that any bulk material does not have. Currently, it is greatly expected on a variety of technological applications with making the best use of such the characteristics, in individual fields of such as electronics, bio, energy, or the like.

In particular, it is greatly expected on a fine particle of metal having the particle diameter of not larger than 1 μm and comprised of a metal and/or an alloy thereof for industrial general purpose, such as copper, nickel, cobalt, iron, zinc, tin, silver, or the like, as a formation material for a surface mounted component, such as an electrically conductive circuit, a bump, a via, a pad, or the like, as a magnetic element for a high density magnetic storage medium and for an antenna, and as a catalyst material for a gas modification filter and for an electrode of a fuel cell.

Regarding a method for producing the fine particle of a metal having such a small particle diameter, there are a vapor phase synthesis method and a liquid phase synthesis method. Here, the vapor phase synthesis method is a method to form a fine particle of a metal as a solid state from a metal vapor introduced into a vapor phase. The liquid phase synthesis method is a method to precipitate a fine particle of a metal by reducing a metal ion dispersed into a solution. Moreover, regarding such the liquid phase synthesis method, it is known in general that there are a method using a reducing agent for reducing such the metal ion and a method to perform a reduction electrochemically on a cathode electrode.

Further, in recent years, an attention is focused on a technology that a wiring pattern is formed using an ink-jet method with an ink containing a fine particle of a metal and then a wiring is formed by baking thereof. However, in a case of using the ink containing the fine particle of a metal as ink for the ink-jet, it is important to retain dispersibility in the ink for a long period of time. A method for producing a fine particle of a metal is proposed therefor to retain the dispersibility for the long period of time in the ink.

Moreover, regarding a method for obtaining a metallic thin film or a thin metallic wire, by baking after drying a fine particle dispersion of metal, there are disclosed patent documents as described below.

According to a patent document 1, regarding a method for obtaining a fine particle of copper, there is disclosed an electrically conductive fine layer of copper to be formed by forming a fine particle of copper having a particle diameter of not larger than 50 nm containing palladium in a polyethylene glycol solution or an ethylene glycol solution by adding a palladium ion for nucleation with adding polyethyleneimine as a dispersing agent, by performing a pattern print onto a substrate using such a fine particle dispersion of copper, and then by performing a heat treatment therefor in an atmospheric current of 4% $H_2$—$N_2$ for approximately three hours at a temperature of 250° C.

According to a patent document 2, there is disclosed a pattern of a metal wiring to be obtained by coating ink for a ink-jet onto a substrate using the ink-jet method, which contains a fine particle of a metal oxide having a primary particle diameter of not larger than 100 nm, and then by performing reduction of a cuprous oxide by performing a heat treatment therefor in a hydrogen gaseous atmosphere for approximately one hour at a temperature of 350° C.

According to a patent document 3, there is disclosed a thin film of silver to be produced by coating a nano particle of a metal onto a substrate (a glass) using a spin coat method, on which an organic metal compound as a dispersing agent is attached to around the metal, by drying it at a temperature of 100° C., and then by baking it at a temperature of 250° C.

Furthermore, according to a patent document 4, there is disclosed a thin film of copper to be obtained by concentrating a cuprous oxide to have a concentration of 30% by weight, which is suspended into diethylene glycol, in which secondary particles have a mean particle diameter of 500 nm, by performing further an ultrasonic wave treatment to be electrically conductive ink, by coating it onto a slide glass, and then by heating it in a reducing atmosphere for approximately one hour at a temperature of 350° C.

[Patent Document 1] Japanese Patent Application Publication No. 2005-330552
[Patent Document 2] Japanese Patent Application Publication No. 2004-277627
[Patent Document 3] Japanese Patent Application Publication No. 2005-081501
[Patent Document 4] Japanese Patent Application Publication No. 2004-323568

DISCLOSURE OF THE INVENTION

Problems to be Solved by the Invention

According to the conventional producing method regarding the above mentioned patent documents 1 and 2, and the patent document 3 and the patent document 4, there is a problem that it is not able to obtain a metal member of electrically conductive unless an organic metal compound is attached to the metal particle as a dispersing agent, a heat treatment is performed at a relatively high temperature of 350° C. approximately, or it is performed in a reducing gaseous atmosphere with using such as hydrogen gas or the like at the period of a heat treatment.

Means for Solving the Problem

With having regard to the above mentioned conventional technologies, the present inventors have found out that it is able to obtain a fine particle dispersion, which is superior in dispersibility and storage stability for a long period of time, in a case of using a mixed organic solvent containing an organic solvent having an amide group and another predetermined organic solvent at the time of dispersing a fine particle of metal or the like, in which at least a part of a surface is coated with a polymer dispersing agent, that it is not required to use a reducing gaseous atmosphere and it is possible to bake at a relatively lower baking temperature in a case of obtaining a metallic thin film, a thin metallic wire, or the like, by arranging the fine particle dispersion onto a substrate and then by baking after drying, and that the metallic thin film, the thin metallic wire, or the like, obtained thereby has an excellent electrical conductivity and an excellent substrate adherence, thereby completing the present invention.

The present invention is to provide a fine particle dispersion (hereinafter, referred to as a first aspect as well), which is characterized in that:

(1) A fine particle dispersion in which a fine particle (P) comprised of one type or not less than two types of a metal, an alloy, and/or a metallic compound, having a mean particle diameter of between 1 nm and 150 nm for primary particles thereof, with being coated at least a part of a surface thereof with a polymer dispersing agent (D), is dispersed in a mixed organic solvent, wherein a weight ratio of (D/P) between the polymer dispersing agent (D) coating the surface of the fine particle (P) and the fine particle (P) in the dispersion is between 0.001 and 10, and the mixed organic solvent is one of:

(i) a mixed organic solvent (S1) which contains at least an organic solvent (A) as between 50% and 95% by volume having an amide group, and a low boiling point organic solvent (B) as between 5% and 50% by volume having a boiling point of between 20° C. and 100° C. at a normal pressure;

(ii) a mixed organic solvent (S2) which contains at least the organic solvent (A) as between 50% and 95% by volume having the amide group, and an organic solvent (C) as between 5% and 50% by volume having a boiling point of higher than 100° C. at a normal pressure and comprised of an alcohol and/or a polyhydric alcohol having one or not less than two hydroxyl groups in a molecule thereof; or (iii) a mixed organic solvent (S3) which contains at least the organic solvent (A) as between 50% and 94% by volume having the amide group, the low boiling point organic solvent (B) as between 5% and 49% by volume having the boiling point of between 20° C. and 100° C. at the normal pressure, and the organic solvent (C) as between 1% and 45% by volume having the boiling point of higher than 100° C. at the normal pressure and comprised of the alcohol and/or the polyhydric alcohol having the one or not less than the two hydroxyl groups in the molecule thereof.

Regarding the fine particle dispersion according to the above mentioned first aspect, it is characterized in the aspects (2) to (7) described below as well.

(2) The organic solvent (A) is one type or not less than two types selected from N-methylacetamide, N-methylformamide, N-methylpropanamide, formamide, N,N-dimethylacetamide, 1,3-dimethyl-2-imidazolidinone, N,N-dimethylformamide, 1-methyl-2-pyrrolidone, hexamethylphosphorictriamide, 2-pyrrolidinone, ∈-caprolactam, and acetamide.

(3) The organic solvent (B) is one type or not less than two types selected from an ether based compound (B1) expressed by a general form $R^1$—O—$R^2$ ($R^1$ and $R^2$ are alkyl groups individually having a carbon number between one and four respectively), an alcohol (B2) expressed by a general form $R^3$—OH ($R^3$ is an alkyl group having a carbon number between one and four), a ketone based compound (B3) expressed by a general form $R^4$—C(=O)—$R^5$ ($R^4$ and $R^5$ are alkyl groups individually having a carbon number one or two respectively), and an amine based compound (B4) expressed by a general form $R^6$—(N—$R^7$)—$R^8$ ($R^6$, $R^7$ and $R^8$ are alkyl groups individually having a carbon number between zero and two respectively or a hydrogen atom).

(4) The organic solvent (B) is one of:

the ether based compound (B1) of one type or not less than two types selected from diethyl ether, methyl propyl ether, dipropyl ether, diisopropyl ether, methyl-t-butyl ether, t-amyl methyl ether, divinyl ether, ethyl vinyl ether, and aryl ether;

the alcohol (B2) of one type or not less than two types selected from methanol, ethanol, 1-propanol, 2-propanol, 2-butanol, and 2-methyl 2-propanol;

the ketone based compound (B3) of one type or not less than two types selected from acetone, methyl ethyl ketone, and diethyl ketone; or the amine based compound (B4) as triethylamine and/or diethylamine.

(5) The organic solvent (C) is one type or not less than two types selected from ethylene glycol, diethylene glycol, 1,2-propanediol, 1,3-propanediol, 1,2-butanediol, 1,3-butanediol, 1,4-butanediol, 2-butene-1,4-diol, 2,3-butanediol, pentanediol, hexanediol, octanediol, glycerol, 1,1,1-trishydroxymethylethane, 2-ethyl-2-hydroxymethyl-1,3-propanediol, 1,2,6-hexanetriol, 1,2,3-hexanetriol, 1,2,4-butanetriol, threitol, erythritol, pentaerythritol, pentitol, and hexitol.

(6) The polymer dispersing agent (D) is one type or not less than two types selected from polyvinylpyrrolidone, polyethyleneimine, polyacrylic acid, carboxymethylcellulose, polyacrylamide, polyvinyl alcohol, polyethylene oxide, starch, and gelatin.

(7) The metal is one type or not less than two types selected from copper, silver, gold, nickel, cobalt, iron, zinc, tin, aluminum, bismuth, platinum, rhodium, palladium, ruthenium, manganese, chromium, vanadium, and titanium, the alloy is an alloy comprised of not less than two types of the metals, and the metallic compound is an oxide of the metal and the alloy.

Moreover, the present invention is to provide a method for producing a fine particle dispersion (hereinafter, referred to as a second aspect as well), which is characterized in that:

(8) A method for producing a fine particle dispersion in which a fine particle (P) comprised of one type or not less than two types of a metal, an alloy, and a metallic compound, having a mean particle diameter of between 1 nm and 150 nm for primary particles thereof, with being coated at least a part of a surface thereof with a polymer dispersing agent (D), is dispersed in a mixed organic solvent, wherein a weight ratio of (D/P) between the polymer dispersing agent (D) coating the surface of the fine particle (P) and the fine particle (P) in the dispersion is between 0.001 and 10, and the fine particle (P) in which at least the part of the surface is coated by the polymer dispersing agent (D) is dispersed into one of:

(i) a mixed organic solvent (S1) which contains at least an organic solvent (A) as between 50% and 95% by volume having an amide group, and a low boiling point organic solvent (B) as between 5% and 50% by volume having a boiling point of between 20° C. and 100° C. at a normal pressure;

(ii) a mixed organic solvent (S2) which contains at least the organic solvent (A) as between 50% and 95% by volume having the amide group, and an organic solvent (C) as between 5% and 50% by volume having a boiling point of higher than 100° C. at a normal pressure and comprised of an alcohol and/or a polyhydric alcohol having one or not less than two hydroxyl groups in a molecule thereof; or (iii) a mixed organic solvent (S3) which contains at least the organic solvent (A) as between 50% and 94% by volume having the amide group, the low boiling point organic solvent (B) as between 5% and 49% by volume having the boiling point of between 20° C. and 100° C. at the normal pressure, and the organic solvent (C) as between 1% and 45% by volume having the boiling point of higher than 100° C. at the normal pressure and comprised of the alcohol and/or the polyhydric alcohol having the one or not less than the two hydroxyl groups in the molecule thereof.

Regarding the method for producing the fine particle dispersion according to the above mentioned second aspect, it is characterized in the aspects (9) to (15) described below as well.

(9) The fine particle (P), at least the part of the surface of which is coated by the polymer dispersing agent (D), is obtained by the following steps of:

(a) Process 1: reducing at least one type of a metal ion by an electrolytic reduction or an electroless reduction using a reducing agent in an aqueous solution in which the metal ion and a polymer dispersing agent (D) are dissolved, and forming thereby a fine particle dispersion aqueous solution, wherein the fine particle (P) comprised of one type or not less than two types of the metal, the alloy, and the metallic compound, having the mean particle diameter of between 1 nm and 150 nm for the primary particles, is dispersed with being coated by the polymer dispersing agent (D); and (b) Process 2: separating and collecting the fine particle (P), at least the part of the surface of which is coated with the polymer dispersing agent (D), from the fine particle dispersion aqueous solution obtained at Process 1.

(10) The organic solvent (A) is one type or not less than two types selected from N-methylacetamide, N-methylformamide, N-methylpropanamide, formamide, N,N-dimethylacetamide, 1,3-dimethyl-2-imidazolidinone, N,N-dimethylformamide, 1-methyl-2-pyrrolidone, hexamethylphosphorictriamide, 2-pyrrolidinone, ∈-caprolactam, and acetamide.

(11) The organic solvent (B) is one type or not less than two types selected from an ether based compound (B1) expressed by a general form $R^1$—O—$R^2$ ($R^1$ and $R^2$ are alkyl groups individually having a carbon number between one and four respectively), an alcohol (B2) expressed by a general form $R^3$—OH ($R^3$ is an alkyl group having a carbon number between one and four), a ketone based compound (B3) expressed by a general form $R^4$—C(=O)—$R^5$ ($R^4$ and $R^5$ are alkyl groups individually having a carbon number one or two respectively), and an amine based compound (B4) expressed by a general form $R^6$—(N—$R^7$)—$R^8$ ($R^6$, $R^7$ and $R^8$ are alkyl groups individually having a carbon number between zero and two respectively or a hydrogen atom).

(12) The organic solvent (B) is one of:

the ether based compound (B1) of one type or not less than two types selected from diethyl ether, methyl propyl ether, dipropyl ether, diisopropyl ether, methyl-t-butyl ether, t-amyl methyl ether, divinyl ether, ethyl vinyl ether, and aryl ether;

the alcohol (B2) of one type or not less than two types selected from methanol, ethanol, 1-propanol, 2-propanol, 2-butanol, and 2-methyl 2-propanol;

the ketone based compound (B3) of any one type or not less than two types selected from acetone, methyl ethyl ketone, and diethyl ketone; or the amine based compound (B4) as triethylamine and/or diethylamine.

(13) The organic solvent (C) is one type or not less than two types selected from ethylene glycol, diethylene glycol, 1,2-propanediol, 1,3-propanediol, 1,2-butanediol, 1,3-butanediol, 1,4-butanediol, 2-butene-1,4-diol, 2,3-butanediol, pentanediol, hexanediol, octanediol, glycerol, 1,1,1-trishydroxymethylethane, 2-ethyl-2-hydroxymethyl-1,3-propanediol, 1,2,6-hexanetriol, 1,2,3-hexanetriol, 1,2,4-butanetriol, threitol, erythritol, pentaerythritol, pentitol, and hexitol.

(14) The polymer dispersing agent (D) is one type or not less than two types selected from polyvinylpyrrolidone, polyethyleneimine, polyacrylic acid, carboxymethylcellulose, polyacrylamide, polyvinyl alcohol, polyethylene oxide, starch, and gelatin.

(15) The metal is one type or not less than two types selected from copper, silver, gold, nickel, cobalt, iron, zinc, tin, aluminum, bismuth, platinum, rhodium, palladium, ruthenium, manganese, chromium, vanadium, and titanium, the alloy is an alloy comprised of not less than two types of the metals, and the metallic compound is an oxide of the metal and the alloy.

Effects of the Invention

According to the fine particle dispersion regarding the present invention, the above mentioned mixed organic solvent (S1), the mixed organic solvent (S2), or the mixed organic solvent (S3) is used as the mixed organic solvent for dispersing the fine particle (P). The fine particle dispersion according to the present invention is superior in dispersibility and storage stability for a long period of time, because a dispersing action of the polymer dispersing agent (D) and the dispersing action of the mixed organic solvent act synergically. Moreover, it is not required to use a reducing gaseous atmosphere and it becomes possible to bake at a relatively lower temperature in a case of obtaining a metallic thin film, a thin metallic wire, or the like, by arranging the fine particle dispersion according to the present invention onto a substrate and baking after drying therefor. Furthermore, the metallic thin film, the thin metallic wire, or the like, to be obtained therefrom has an excellent electrical conductivity and an excellent substrate adherence.

BEST MODE FOR CARRYING OUT THE INVENTION

Hereinafter, there are referred as well that a fine particle according to the present invention is to as a fine particle (P), a metal, an alloy, and a metallic compound comprising the fine particle (P) is to as a metal or the like, an organic solvent (A) having an amide group is to as an organic solvent (A), a low boiling point organic solvent (B) having a boiling point of between 20° C. and 100° C. at a normal pressure is to as an organic solvent (B), an organic solvent (C) having a boiling point of higher than 100° C. at a normal pressure and comprised of alcohol and/or polyhydric alcohol having one or not less than two hydroxyl groups in a molecule thereof is to as an organic solvent (C), and a mixed organic solvent (S1), a mixed organic solvent (S2) and a mixed organic solvent (S3) are combined and to as a mixed organic solvent or the like, respectively.

1. Regarding the Fine Particle Dispersion as the First Embodiment

The fine particle dispersion according to the first embodiment regarding the present invention is characterized in that:

a fine particle dispersion in which a fine particle (P) comprised of one type or not less than two types of a metal, an alloy, and a metallic compound, having a mean particle diameter of between 1 nm and 150 nm for primary particles thereof, with being coated at least a part of a surface thereof with a polymer dispersing agent (D), is dispersed in a mixed organic solvent, wherein a weight ratio of (D/P) between the polymer dispersing agent (D) coating the surface of the fine particle (P) and the fine particles (P) in the dispersion is between 0.001 and 10, and the mixed organic solvent is one of:

(i) a mixed organic solvent (S1) which contains at least an organic solvent (A) as between 50% and 95% by volume having an amide group, and a low boiling point organic solvent (B) as between 5% and 50% by volume having a boiling point of between 20° C. and 100° C. at a normal pressure;

(ii) a mixed organic solvent (S2) which contains at least the organic solvent (A) as between 50% and 95% by volume having the amide group, and an organic solvent (C) as between 5% and 50% by volume having a boiling point of higher than 100° C. at a normal pressure and comprised of an alcohol and/or a polyhydric alcohol having one or not less than two hydroxyl groups in a molecule thereof; or (iii) a mixed organic solvent (S3) which contains at least the organic solvent (A) as between 50% and 94% by volume having the amide group, the low boiling point organic solvent (B) as between 5% and 49% by volume having the boiling point of between 20° C. and 100° C. at the normal pressure, and the organic solvent (C) as between 1% and 45% by volume having the boiling point of higher than 100° C. at the normal pressure and comprised of the alcohol and/or the polyhydric alcohol having the one or not less than the two hydroxyl groups in the molecule thereof.

Regarding the fine particle (P) according to the present invention, it is able to use also a fine particle (P) produced using either method of the vapor phase synthesis method and the liquid phase synthesis method (or the liquid phase reduction method) as far as it is in a state in which at least a part of a surface of the fine particle (P) is coated with the polymer dispersing agent (D) in such as a mixed organic solvent or the like. Moreover, the fine particle produced using the vapor phase synthesis method may be added once into another organic solvent or an inorganic solvent, such as an aqueous solution or the like, with the polymer dispersing agent (D), and then may be collected as the fine particle (P) coated with the polymer dispersing agent (D) from such the solvent after agitating and dispersing therefor. Further, it is able to collect as the fine particle (P), at least the part of the surface of which is coated with the polymer dispersing agent (D), by performing a treatment as described below for the fine particles (P) to be secondary agglomerated at the time of collecting therefor.

Still further, in a case where a fine particle (P) is formed using the liquid phase reduction under the existence of the polymer dispersing agent (D), it may be as the fine particle (P), wherein a fine particle (P) is agglomerated or precipitated by adding an oxidizer after finishing a reductive reaction to a solution in which the fine particle (P) is coated with the polymer dispersing agent (D) and dispersed therein, and then the agglomerated fine particle (P) with being coated by the polymer dispersing agent (D) is collected by performing an operation of such as a filtration or the like.

Furthermore, a fine particle (P) without being coated with the polymer dispersing agent (D) and a member in which the polymer dispersing agent (D) is dispersed into the mixed organic solvent or the like according to the present invention are included within a technical scope of the present invention as well.

Next, the metal, the alloy and the metallic compound, the polymer dispersing agent (D) and the mixed organic solvent according to the fine particle dispersion as the first embodiment will be described in detail below.

(1) Regarding the Metal, the Alloy and the Metallic Compound

There is no limitation in particular regarding the metal, the alloy and the metallic compound (the metal or the like) according to the present invention, and it is possible to select properly depending on the intended use. For example, it is possible to select from any one type or not less than two types of metals selected from copper, silver, gold, nickel, cobalt, iron, zinc, tin, aluminum, bismuth, platinum, rhodium, palladium, ruthenium, manganese, chromium, vanadium titanium, or the like, an alloy comprised of not less than two types of such the metals, and a metallic compound of any one type or not less than two types of such the metals.

Moreover, the above mentioned metallic compound includes an oxide of a metal and of an alloy as well. In most of the cases of producing the fine particle (P) according to the present invention by using a liquid phase reduction, there is included the oxide of the metal and/or of the alloy. In particular, it can be said that there is few member which does not include such the oxide at all in a case of a transition metal particle, such as copper or the like. An oxidation level in such a case is various depending on an atmosphere at a period of generating a fine particle and of storing it, on a temperature thereof, and on a retention time thereof. And then sometimes there is a case where an inside of the fine particle (P) is still remaining as the metal state while just a most surface thereof is oxidized thinly, or there is a case where the fine particle (P) is almost oxidized. Thus, the metallic compound according to the present invention includes a particle of such the various oxidation states.

Regarding the above mentioned metals, it is preferable to use a metal of any one type or not less than two types of metals selected from Cu, Ag, Au, or the like, or an alloy comprised of not less than two types of such the metals.

(2) Regarding the Mean Particle Diameter of the Primary Particles for the Fine Particle (P)

The mean particle diameter of the primary particles for the fine particle (P) is between 1 nm and 150 nm. Here, a primary particle diameter means a diameter of the primary particle for individual fine particles (P) of metal or the like comprising a secondary particle. It is able to measure such the primary particle diameter using a transmission electron microscope. Moreover, the mean particle diameter means a number-average particle diameter of the fine particles (P) of metal or the like.

Here, regarding the mean particle diameter of the primary particles for the fine particle (P), it is desirable for the primary particle diameter to be as not larger than 150 nm, according to taking into consideration regarding such as forming a dense metal coating or the like by arranging the dispersion on a substrate and then by baking therefor. Moreover, it is preferable therefor to be as between 1 nm and 100 nm for all practical purposes, according to taking into consideration regarding the production of the fine particle (P).

(3) Regarding the Polymer Dispersing Agent (D)

The polymer dispersing agent (D) has solubility in water, and has a function to maintain in good condition the dispersibility with preventing from agglomerating the fine particle of metal or the like by existing in a solvent with like coating a surface of the fine particle comprised of the metal or the like.

Moreover, the polymer dispersing agent (D) according to the present invention is used for improving a dispersibility at the time of dispersing a fine particle (P) into an organic solvent after forming a metal or the like in a case where such the fine particle (P) of the metal or the like is produced using the vapor phase synthesis method. Further, in a case where a fine particle (P) of a metal or the like is produced using the liquid phase reduction in an aqueous solution, such as the electrolytic reduction for a metal ion, the electroless reduction with a reducing agent, or the like, a water soluble polymer dispersing agent (D) is dissolved into such the aqueous solution first, and then it is able to form efficiently the fine particle (P) as well, with suppressing the agglomeration of the fine particles (P) of the metal or the like to be precipitated by the reductive reaction.

Still further, it may be also available to use a fine particle of a metal or the like, wherein it is formed using the vapor phase synthesis method or the liquid phase synthesis method, the fine particle of the metal or the like, a surface of which is not coated with the polymer dispersing agent (D), and the polymer dispersing agent (D) are added into the mixed organic solvent according to the present invention and agitated thereafter, a surface of a fine particle (P) of the metal or the like is coated thereby with the polymer dispersing agent (D), and then the dispersibility thereof becomes to be improved thereby.

Still further, there is no limitation in particular regarding the polymer dispersing agent (D) according to the present invention, as far as it has the above mentioned functions and then obtains a dispersing action with suppressing the agglomeration of the fine particles (P) of the metal or the like in the mixed organic solvent according to the present invention.

Still further, the mechanism is not completely clarified for the polymer dispersing agent (D) to disperse the fine particle (P) of the metal or the like. However, it is predicted for example that there is generated a repulsive force for the fine particles (P) of the metal or the like so as not to approach to each other, because an atomic part, which has an unshared electron pair in a functional group existing in the polymer dispersing agent (D), is adsorbed on a surface of the fine particles (P) of the metal or the like and then forms a molecular layer comprised of a polymer.

Still further, such the polymer dispersing agent (D) is water soluble, and has a function to retain very well the dispersibility with suppressing the agglomeration of the fine particles (P) of the metal or the like, by existing with like coating the surface of the fine particle (P) comprised of the metal or the like precipitated in the reaction system. Still further, it functions to suppress the agglomeration of the fine particles (P) of the metal or the like and to retain the dispersibility thereof in the organic solvent to be used for the present invention as well.

Still further, in a case of forming a fine particle (P) of a metal or the like in an aqueous solution using the liquid phase reduction under the existence of the polymer dispersing agent (D), such the polymer dispersing agent (D) has solubility in water, and functions to suppress the agglomeration of the fine particles (P) of the metal or the like and to retain the dispersibility thereof, by existing with like coating the surface of the fine particle (P) of the metal or the like precipitated therefrom. Furthermore, in the case of such the liquid phase reduction, the polymer dispersing agent (D) is used as a material for improving the dispersibility of the fine particles (P) of the metal or the like, without separating in a positive way from the fine particles (P) of the metal or the like after finishing the reductive reaction, with removing another impurity as required.

Regarding the polymer dispersing agent (D), it is available to use any member, as far as a molecular weight thereof is between 100 and 100,000, though it depends on a chemical structure thereof, as far as it has solubility in water, as far as it is separated and collected from an aqueous solution with a state of coating the surface of the fine particle (P) of the metal or the like, and as far as it is possible to disperse preferably the fine particle (P) of the metal or the like in the mixed organic solvent according to the present invention.

It is preferable for the polymer dispersing agent (D) to be as any one type or not less than two types selected from: a polymer of an amine system, such as polyvinylpyrrolidone, polyethyleneimine, or the like; a polymer of a hydrocarbon system having a carboxylic acid function, such as polyacrylic acid, carboxymethylcellulose, or the like; acrylamide, such as polyacrylamide or the like; polyvinyl alcohol; polyethylene oxide; starch; and gelatin.

As examples for the above exemplary mentioned polymer dispersing agent (D) compound, it is able to provide such as polyvinylpyrrolidone (the molecular weight: 1,000 to 500,000), polyethyleneimine (the molecular weight: 100 to 100,000), carboxymethylcellulose (substitution degree from a hydroxyl group Na salt to a carboxymethyl group regarding an alkali cellulose: not less than 0.4, the molecular weight: 1,000 to 100,000), polyacrylamide (the molecular weight: 100 to 6,000,000), polyvinyl alcohol (the molecular weight: 1,000 to 100,000), polyethylene glycol (the molecular weight: 100 to 50,000), polyethylene oxide (the molecular weight: 50,000 to 900,000), gelatin (a mean molecular weight: 61,000 to 67,000), a water soluble starch, or the like.

The number-average molecular weight of the polymer dispersing agent (D) are shown in the above expressed parentheses respectively. Moreover, a member within a range of such the molecular weight has water solubility, and then it is able to use preferably for the present invention. Further, it is able to use with mixing not less than two types thereof as well.

Still further, in addition thereto, it is able to provide as examples, such as thiol, carboxylic acid, amide, carbonitrile and a sort of ester. Still further, it is able to exemplary mention as a polymer having a polar group, such as polymethyl vinyl ether or the like.

Still further, the weight ratio of (D/P) between the polymer dispersing agent (D) coating a surface of the fine particle (P) and the fine particles (P) in such the dispersion is not less than 0.001, but not higher than 10 from a viewpoint for practice.

In a case where the above mentioned weight ratio is less than 0.001, there may be a case that it is not able to obtain an effect sufficiently to suppress the agglomeration of the fine particles (P) with each other. Meanwhile, in a case where the ratio is more than 10, there may be a case that excessive polymer dispersing agent (D) may prevent from sintering the fine particle (P) of the metal or the like at the periods of drying and baking after coating the fine particle dispersion, and then a dense property as the layer quality may become decreased thereby, even if there is no difficulty on the dispersion thereof, and that a residual substance after baking of the polymer dispersing agent (D) may remain in a metal coating inside, and then an electrical conductivity thereof may become decreased thereby.

Still further, regarding the above mentioned weight ratio of (D/P) as to be within the range of between 0.001 and 10, it is possible to confirm by a quantitative analysis for the fine particle (P) coated with the polymer dispersing agent (D) from the fine particle dispersion by performing an operation of such as a centrifugal separation or the like.

Still further, as one example therefor: there is performed a sampling from a fine particle dispersion; the fine particle (P)

coated with the polymer dispersing agent (D) is collected as a sample for analysis by the operation of the centrifugal separation; a solution is prepared, wherein a copper particle is dissolved under a condition for the polymer dispersing agent (D) as not to be reacted in an oxidizing solution; and then it becomes able to measure the weight ratio of (D/P) by performing the quantitative analysis for such the solution using a liquid chromatography or the like.

Furthermore, an operation of a concentration of such as evaporation or the like is performed on a sample of the above mentioned fine particle (P) for an analysis in a case of being required therefor, after extracting the polymer dispersing agent (D) from the fine particles (P) into the solvent. And then it is possible to perform thereafter using an analysis, such as the liquid chromatography, an X-ray photoelectron spectroscopy (XPS), an Auger electron spectroscopy (AES), or the like, for a specific element (a nitrogen, a sulfur, or the like) in the polymer dispersing agent (D).

(4) Regarding the Mixed Organic Solvent or the Like

Here, regarding the mixing ratio for individual types of the solvent regarding the above mentioned mixed organic solvent (S1), the mixed organic solvent (S2) and the mixed organic solvent (S3), it is to be based on a volume ratio for the individual solvents before mixing the solvents (hereinafter, ditto regarding the second embodiment).

(4-1) Regarding the Mixed Organic Solvent (S1)

The organic solvent (S1) is an organic solvent which contains at least the organic solvent (A) as between 50% and 95% by volume and the organic solvent (B) as between 5% and 50% by volume.

Regarding the mixed organic solvent (S1), the organic solvent (A) improves the dispersibility and the storage stability in the mixed organic solvent, and it has a function to improve also the substrate adherence in a case where it is baked onto a substrate at a state of containing the above mentioned fine particle (P) of the metal or the like.

The organic solvent (B) is considered to reduce an interaction between the solvent molecules in the mixed organic solvent, and to have a function to improve an affinity for the fine particle (P) and for the solvent. Such the effect is expected regarding a solvent having a lower boiling point in general, and it is desirable to use an organic solvent in particular having a boiling point of not higher than 100° C. at a normal pressure, because it is able to obtain the effect to reduce the effective interaction between the solvent molecules. Here, it is able to provide as an example for a preferred organic solvent (B), such as an ether based compound (B1), an alcohol (B2), a ketone based compound (B3) and an amine based compound (B4) as described below. And, it is preferable to use the ether based compound (B1) in particular among these, because it has a larger effect for reducing such the interaction between the solvent molecules thereof.

Moreover, by using the organic solvent (B), it is able to shorten extremely a period for agitation in a case of performing a preparation of the fine particle dispersion with irradiating a ultrasonic wave or the like. For example, it is possible to shorten to be one second thereof approximately. Further, it is possible to re-disperse easily even in a case where the fine particles become an agglomerated state once, if the organic solvent (B) exists in the mixed organic solvent.

Still further, a meaning that the mixed organic solvent (S1) is a mixed organic solvent which contains at least the organic solvent (A) as between 50% and 95% by volume and the organic solvent (B) as between 5% and 50% by volume is that the mixed organic solvent (S1) may be mixed to be as 100% by volume with the above mentioned mixing ratio using the organic solvent (A) and the organic solvent (B), and also that another organic solvent component may be mixed within a range of the above mentioned mixing ratio and also within a scope as not lose the advantage of the present invention. In such a case, it is desirable to contain the component as not less than 90% by volume, which is comprised of the organic solvent (A) and the organic solvent (B), and it is further preferable to contain as not less than 95% by volume.

Still further, in a case of mixing any other organic solvent components than the above mentioned organic solvent (A) and the organic solvent (B), it is able to use a polar organic solvent, such as tetrahydrofuran, diglyme, ethylene carbonate, propylene carbonate, sulfolane, dimethylsulfoxide, or the like.

Still further, it is more desirable for a mixing amount of the organic solvent (A) in the mixed organic solvent (S1) to be as between 60% and 90% by volume, for functioning effectively the above mentioned aspects. Furthermore, it is more desirable for a mixing amount of the organic solvent (B) to be as between 10% and 30% by volume.

(4-2) Regarding the Mixed Organic Solvent (S2)

The mixed organic solvent (S2) is a mixed organic solvent which contains at least the organic solvent (A) as between 50% and 95% by volume and the organic solvent (C) as between 5% and 50% by volume.

In the mixed organic solvent (S2), the organic solvent (A) has the function similar to that regarding the above mentioned mixed organic solvent (S1).

The organic solvent (C) improves the dispersibility in the mixed organic solvent, and has a function to suppress a connection of the fine particles (P) together as time passes. Moreover, in a case where the organic solvent (C) is to be existed in the mixed organic solvent, it becomes able to obtain a baked layer having an improved uniformity thereof and a higher electrical conductivity even at a relatively lower baking temperature in a case where the fine particle dispersion thereof is coated and sintered onto a substrate.

Further, a meaning that the mixed organic solvent (S2) is the mixed organic solvent which contains at least the organic solvent (A) as between 50% and 95% by volume and the organic solvent (C) as between 5% and 50% by volume is that the mixed organic solvent (S2) may be mixed to be as 100% by volume with the above mentioned mixing ratio using the organic solvent (A) and the organic solvent (C), and also that another organic solvent component may be mixed within a range of the above mentioned mixing ratio and also within a scope as not lose the advantage of the present invention. In such a case, it is desirable to contain the component as not less than 90% by volume, which is comprised of the organic solvent (A) and the organic solvent (C), and it is further preferable therefor to contain as not less than 95% by volume.

Still further, in a case of mixing any other organic solvent components than the above mentioned ones, it is able to use the polar organic solvent, such as the tetrahydrofuran, the diglyme, the ethylene carbonate, the propylene carbonate, the sulfolane, the dimethylsulfoxide, or the like.

Still further, it is more desirable for a mixing amount of the organic solvent (A) in the mixed organic solvent (S2) to be as between 60% and 90% by volume for functioning effectively the above mentioned aspects. Furthermore, it is more desirable for a mixing amount of the organic solvent (C) to be as between 10% and 40% by volume.

(4-3) Regarding the Mixed Organic Solvent (S3)

The mixed organic solvent (S3) is a mixed organic solvent which contains at least the organic solvent (A) as between 50% and 94% by volume, the organic solvent (B) as between 5% and 49% by volume, and the organic solvent (C) as between 1% and 45% by volume.

Here, the detail regarding the organic solvent (A) and the organic solvent (B) according to the mixed organic solvent (S3) is similar to that described in the above mentioned mixed organic solvent (S1), except the concentration of the organic solvent (A) as between 50% and 94% by volume.

The organic solvent (C) improves the dispersibility in the mixed organic solvent, and also it has an advantage in particular as mentioned below. That is to say, the mixed organic solvent containing the organic solvent (A) and the organic solvent (B) has an excellent dispersibility by the agitation therefor, however, there is a tendency generally that the fine particles in the organic solvent are connected together as time passes. On the contrary, in a case where the organic solvent (C) is to be existed in the mixed organic solvent, it becomes possible to design a further stability in a longer period of time for the dispersing agent with suppressing effectively such the connection therebetween. Moreover, in the case where the organic solvent (C) is to be existed in the mixed organic solvent, it becomes possible to improve a uniformity of a sintered layer in a case where such the fine particle dispersion is coated and sintered onto a substrate, and then it becomes able to obtain thereby the baked layer having a higher electrical conductivity.

Further, a meaning that the mixed organic solvent (S3) is a mixed organic solvent which contains at least the organic solvent (A) as between 50% and 94 by volume having the amide group, the organic solvent (B) as between 5% and 49% by volume and the organic solvent (C) as between 1% and 45% by volume is that the mixed organic solvent (S3) may be mixed to be as 100% by volume with the above mentioned mixing ratio using the organic solvent (A), the organic solvent (B) and the organic solvent (C), and also that another organic solvent component may be mixed within a range of the above mentioned mixing ratio and also within a scope as not lose the advantage of the present invention. In such a case, it is desirable to contain the component as not less than 90% by volume, which is comprised of the organic solvent (A), the organic solvent (B) and the organic solvent (C), and it is further preferable therefor to contain as not less than 95% by volume.

Still further, in a case of mixing any other organic solvent components than the above mentioned ones, it is desirable to use the polar organic solvent, such as the tetrahydrofuran, the diglyme, the ethylene carbonate, the propylene carbonate, the sulfolane, the dimethylsulfoxide, or the like.

Still further, it is more desirable for a mixing amount of the organic solvent (A) in the mixed organic solvent (S3) to be as between 60% and 90% by volume for functioning effectively the above mentioned aspects. Still further, it is more desirable for a mixing amount of the organic solvent (B) to be as between 10% and 30% by volume. Furthermore, it is more desirable for a mixing amount of the organic solvent (C) to be as between 10% and 30% by volume.

As described above;

(i) The mixed organic solvent (S1), which contains the organic solvent (A) and the organic solvent (B) with a predetermined rate respectively, is easily dispersed by performing the agitation using such as the ultrasonic wave or the like, and superior in dispersibility. And then it is possible to re-disperse easily even in the case where particles become the agglomerated state once.

(ii) The mixed organic solvent (S2), which contains the organic solvent (A) and the organic solvent (C) with a predetermined rate respectively, is superior in stability of the dispersibility for a long period of time. And then it becomes possible to bake at the relatively lower temperature in the case where the fine particle dispersion thereof is coated and sintered onto the substrate.

(iii) The mixed organic solvent (S3), which contains the organic solvent (A), the organic solvent (B) and the organic solvent (C) with a predetermined rate respectively, further improves the dispersibility, the stability and the degree of sintering.

Such the mixed organic solvent (S1), the mixed organic solvent (S2) and the mixed organic solvent (S3) become to be mixed organic solvents that are superior in dispersibility in a case where that are used for forming a pattern using an ink-jet method.

The following is the description exemplary mentioned regarding the organic solvent (A), the organic solvent (B) and the organic solvent (C).

The organic solvent (A) is a chemical compound having an amide group (—CONH—), and it is desirable in particular to be a type having a higher relative dielectric constant. Here, it is able to provide as examples for such the organic solvent (A), such as N-methylacetamide (191.3 at 32° C.), N-methylformamide (182.4 at 20° C.), N-methylpropanamide (172.2 at 25° C.), formamide (111.0 at 20° C.), N,N-dimethylacetamide (37.78 at 25° C.), 1,3-dimethyl-2-imidazolidinone (37.6 at 25° C.), N,N-dimethylformamide (36.7 at 25° C.), 1-methyl-2-pyrrolidone (32.58 at 25° C.), hexamethylphosphorictriamide (29.0 at 20° C.), 2-pyrrolidinone, ∈-caprolactam, acetamide, or the like. And then it is able to use with mixing thereof as well. Here, the number in each of parentheses after each name of the above mentioned chemical compounds having the amide group designates a relative dielectric constant at a measured temperature for the individual solvent respectively. Moreover, it is able to use preferably N-methylacetamide, N-methylformamide, formamide, acetamide, or the like, among those, due to the relative dielectric constant of not less than 100. Further, in a case of a solid state at a normal temperature for such as N-methylacetamide (a melting point: between 26° C. and 28° C.), it is able to use by mixing with another solvent to become a liquid state at an operation temperature.

The organic solvent (B) is an organic compound having a boiling point within a range of between 20° C. and 100° C. at a normal pressure.

In a case where the boiling point at the normal pressure is lower than 20° C., a component of the organic solvent (B) becomes easily volatilized in a case where a particle dispersion containing the organic solvent (B) is stored at a normal temperature, and then a solvent composition may be changed. While, in a case where the boiling point at the normal pressure is not higher than 100° C., it is expected that a mutual attraction between the solvent molecules becomes to be reduced due to adding such the solvent, and that an effect becomes to be functioned effectively for the dispersibility of the fine particles (P) to be able to improve further.

Moreover, it is able to exemplary mention for the organic solvent (B), such as an ether based compound (B1) expressed by a general form $R^1$—O—$R^2$ ($R^1$ and $R^2$ are alkyl groups individually having a carbon number between one and four respectively), an alcohol (B2) expressed by a general form $R^3$—OH ($R^3$ is an alkyl group having a carbon number between one and four), a ketone based compound (B3) expressed by a general form $R^4$—C(=O)—$R^5$ ($R^4$ and $R^5$ are alkyl groups individually having a carbon number one or two respectively), and an amine based compound (B4) expressed by a general form $R^6$—(N—$R^7$)—$R^8$ ($R^6$, $R^7$ and $R^8$ are alkyl groups individually having a carbon number between zero and two respectively or a hydrogen atom).

Hereinafter, the above mentioned organic solvent (B) is exemplary mentioned. Here, the number in each of parentheses after each name of chemical compounds designates a boiling point thereof at the normal pressure.

Here, it is able to exemplary mention for the above mentioned ether based compound (B1), such as diethyl ether (35° C.), methyl propyl ether (31° C.), dipropyl ether (89° C.), diisopropyl ether (68° C.), methyl-t-butyl ether (55.3° C.), t-amyl methyl ether (85° C.), divinyl ether (28.5° C.), ethyl vinyl ether (36° C.), aryl ether (94° C.), or the like.

Moreover, it is able to exemplary mention for the above mentioned alcohol (B2), such as methanol (64.7° C.), ethanol (78.0° C.), 1-propanol (97.15° C.), 2-propanol (82.4° C.), 2-butanol (100° C.), 2-methyl 2-propanol (83° C.), or the like.

Further, it is able to exemplary mention for the above mentioned ketone based compound (B3), such as acetone (56.5° C.), methyl ethyl ketone (79.5° C.), diethyl ketone (100° C.), or the like.

Still further, it is able to exemplary mention for the above mentioned amine based compound (B4), such as triethylamine (89.7° C.), diethylamine (55.5° C.), or the like.

Still further, the organic solvent (C) is an organic compound having a boiling point of higher than 100° C. at a normal pressure and comprised of an alcohol and/or a polyhydric alcohol having one or not less than two hydroxyl groups in the molecule thereof. In such a case, the alcohol and the polyhydric alcohol therefor both have the boiling points of higher than 100° C. at the normal pressure. Still further, it is desirable to use therefor an alcohol having a carbon number of not less than five, and a polyhydric alcohol having a carbon number of not less than two. It is desirable to use therefor a liquid state type at a normal temperature, and a type having a relative dielectric constant as high as not less than 10 for example.

Still further, it is able to exemplary mention for the organic solvent (C), such as ethylene glycol, diethylene glycol, 1,2-propanediol, 1,3-propanediol, 1,2-butanediol, 1,3-butanediol, 1,4-butanediol, 2-butene-1,4-diol, 2,3-butanediol, pentanediol, hexanediol, octanediol, glycerol, 1,1,1-trishydroxymethylethane, 2-ethyl-2-hydroxymethyl-1,3-propanediol, 1,2,6-hexanetriol, 1,2,3-hexanetriol, 1,2,4-butanetriol, or the like.

Still further, it is possible to use sugar alcohol as well, such as D-threitol, erythritol, pentaerythritol, pentitol, hexitol, or the like, wherein xylitol, ribitol and arabitol are included in pentitol, and mannitol, sorbitol, dulcitol and the like, are included in the above mentioned hexitol. Still further, it is possible to use saccharides as well, such as glyceric aldehyde, dioxy-acetone, threose, erythrulose, erythrose, arabinose, ribose, ribulose, xylose, xylulose, lyxose, glucose, fructose, mannose, idose, sorbose, gulose, talose, tagatose, galactose, allose, altrose, lactose, xylose, arabinose, isomaltose, glucoheptose, heptose, maltotriose, lactulose, trehalose, or the like.

Furthermore, among the above mentioned sort of alcohol, it is more desirable to use polyhydric alcohol having the hydroxyl groups of not less than two in the molecule thereof, and then it is further preferable to use ethylene glycol and glycerin in particular.

Regarding the organic solvent (A), it is necessary therefor to be contained in the mixed organic solvent (S1) and in the mixed organic solvent (S2) as between 50% and 95% by volume respectively, and in the mixed organic solvent (S3) as between 50% and 94% by volume. In a case where the organic solvent (A) is less than 50% by volume therein, there may be insufficient for the dispersibility and the storage stability of a fine particle (P) of a metal or the like in a polar organic solvent. Moreover, it is necessary for the organic solvent (A) to be as not more than 95% by volume for containing the organic solvent (B) as more than 5% by volume in the mixed organic solvent (S1). Further, it is necessary for the organic solvent (A) to be as not more than 94% by volume for containing the organic solvent (B) as more than 5% by volume and for the organic solvent (C) as more than 1% by volume in the mixed organic solvent (S3) respectively. Still further, a desirable concentration of the organic solvent (A) in the mixed organic solvent (S1) and in the mixed organic solvent (S2) is to be as between 60% and 90% by volume respectively, and it is preferable in particular to be as between 65% and 85% by volume therefor respectively. Furthermore, the organic solvent (A) has a function to improve the dispersibility and the storage stability of a fine particle (P) in a mixed organic solvent, and also has a function to improve an electrical conductivity of a baked layer to be obtained by baking the fine particle dispersion according to the present invention after coated onto a substrate.

Regarding the organic solvent (B), it is necessary therefor to be contained in the mixed organic solvent (S1) and in the mixed organic solvent (S3) as not less than 5% by volume respectively. In a case where the organic solvent (B) is less than 5% by volume therein, there may be insufficient for shortening a dispersion time period and for a re-dispersibility thereof in a case of using a physical agitation for fine particles (P) of a metal or the like.

Regarding the organic solvent (C), it is necessary therefor to be contained in the mixed organic solvent (S2) as between 5% and 50% by volume, and in the mixed organic solvent (S3) as between 1% and 45% by volume. By designing the organic solvent (C) as to be such the mixing rate, it becomes able to further improve the dispersion stability regarding the mixed organic solvent (S2) and the mixed organic solvent (S3) with suppressing the agglomeration of the fine particles (P) of the metal or the like even storing for a long period of time. Moreover, it becomes able to further improve a dense property and an electrical conductivity of a baked layer to be obtained in a case of baking a fine particle dispersion thereof.

Further, it is estimated that a part of the organic solvent (C) may exist with like coating a surface of the fine particle (P) in the mixed organic solvent (S3) and may function the above mentioned actions. And then a preferred concentration thereof may be changed corresponding to the concentration of the fine particles (P) existing in the mixed organic solvent (S3). However, it is desirable therefor to be as between 10% and 30% by volume, and further preferable therefor to be as between 15% and 25% by volume.

Regarding the mixed organic solvent to be used for the present invention, it is further preferable for all practical purposes to use as the mixed organic solvent (S1), wherein a concentration of the organic solvent (A) is designed to be as approximately between 50% and 90% by volume, meanwhile, the other component is designed to be as the organic solvent (B), or to use as the mixed organic solvent (S3), wherein all the other components are designed to be as the organic solvent (B) and as the organic solvent (C).

(5) Regarding the Mean Secondary Agglomerated Size in the Mixed Organic Solvent

According to the present invention, the mean particle diameter of the primary particles for the fine particle (P) to be dispersed into the mixed organic solvent is between 1 nm and 150 nm. However, the mixed organic solvent according to the present invention is superior in dispersibility of the fine particle (P), and then it is possible to design easily the mean secondary agglomerated size for the secondary agglomerated particles comprised of such the fine particles (P) to be as not larger than 500 nm, or to be preferably as not larger than 300 nm, by performing an agitation using such as an irradiation of the ultrasonic wave or the like.

(6) Regarding the Fine Particle Dispersion

According to the fine particle dispersion regarding the first embodiment, in a case of collecting and dispersing the fine particle (P), a surface of which is coated with the polymer dispersing agent (D), into the mixed organic solvent or the like according to the present invention, it is considered that an abundance is relatively low regarding the polymer dispersing agent (D) dissolved only in such the mixed organic solvent or the like without existing on the surface of the fine particle (P).

Thus, the fine particle dispersion according to the first embodiment is superior in dispersibility and storage stability of the fine particle (P) of the metal or the like. And then in a case of arranging onto a substrate using the ink-jet method and then of heating and baking after drying therefor, it becomes able to obtain a metallic thin film, a thin metallic wire, or the like, which has an excellent substrate adherence and an excellent electrical conductivity respectively.

2. Regarding the Method for Producing the Fine Particle Dispersion as the Second Embodiment The method for producing the fine particle dispersion as the second embodiment according to the present invention is characterized in that:

a method for producing a fine particle dispersion in which a fine particle (P) comprised of one type or not less than two types of a metal, an alloy, and/or a metallic compound, having a mean particle diameter of between 1 nm and 150 nm for primary particles thereof, with being coated at least a part of a surface thereof with a polymer dispersing agent (D), is dispersed in a mixed organic solvent, wherein a weight ratio of (D/P) between the polymer dispersing agent (D) coating a surface of the fine particle (P) and the fine particles (P) in the dispersion is between 0.001 and 10, and the fine particle (P), at least the part of the surface of which is coated by the polymer dispersing agent (D), is dispersed into one of:

(i) a mixed organic solvent (S1) which contains at least an organic solvent (A) as between 50% and 95% by volume having an amide group, and a low boiling point organic solvent (B) as between 5% and 50% by volume having a boiling point of between 20° C. and 100° C. at a normal pressure;

(ii) a mixed organic solvent (S2) which contains at least the organic solvent (A) as between 50% and 95% by volume having the amide group, and an organic solvent (C) as between 5% and 50% by volume having a boiling point of higher than 100° C. at a normal pressure and comprised of an alcohol and/or a polyhydric alcohol having one or not less than two hydroxyl groups in a molecule thereof; or (iii) a mixed organic solvent (S3) which contains at least the organic solvent (A) as between 50% and 94% by volume having the amide group, the low boiling point organic solvent (B) as between 5% and 49% by volume having the boiling point of between 20° C. and 100° C. at the normal pressure, and the organic solvent (C) as between 1% and 45% by volume having the boiling point of higher than 100° C. at the normal pressure and comprised of the alcohol and/or the polyhydric alcohol having the one or not less than the two hydroxyl groups in the molecule thereof.

(1) Regarding the Fine Particle (P)

Regarding a fine particle (P) comprised of one type or not less than two types of a metal, an alloy, and a metallic compound according to the second embodiment, there is no limitation in particular regarding a method for producing thereof. And, it may be available to be formed using either producing method of the vapor phase synthesis method or a liquid phase reduction method as described in detail later, as far as a mean particle diameter of primary particles therefor is between 1 nm and 150 nm.

Moreover, the above mentioned metal, the alloy and the metallic compound are similar to the metal, the alloy and the metallic compound as described in the first embodiment. Further, the mean particle diameter of the primary particles for the fine particle (P) is similar to that as described in the first embodiment as well.

Still further, in a case where the fine particle (P) is formed using the vapor phase synthesis method, it is also able to disperse the fine particle (P), wherein at least a part of a surface thereof is coated with the polymer dispersing agent (D), by adding the fine particle (P) and the polymer dispersing agent (D) into the mixed organic solvent according to the present invention and then by agitating therefor. Still further, it may be also available to design the following steps of: agitating the fine particle (P) and the polymer dispersing agent (D) in another solvent beforehand; forming the fine particle (P), a surface of which is coated with the polymer dispersing agent (D), in such the solvent; performing an agglomeration, a precipitation, or the like, for such the fine particles (P) in the solvent; and collecting the fine particle (P) therefrom, wherein at least the part of the surface thereof is coated with the polymer dispersing agent (D).

Still further, in a case where the fine particle (P) is formed using the liquid phase reduction, it is desirable to form the fine particle (P) comprised of one type or not less than two types of the metal, the alloy, and the metallic compound as a fine particle, a surface of which is coated with the polymer dispersing agent (D), by reducing a metal ion using the liquid phase reduction in an aqueous solution or an organic solvent, wherein the polymer dispersing agent (D) is dissolved thereinto with having a dispersing action for the fine particle (P). Still further, it is able to perform the above mentioned liquid phase reduction by reducing the metal ion using an electrolytic reduction or an electroless reduction using a reducing agent. Furthermore, it is able to use the heretofore known method for such the liquid phase reduction as well.

(2) Regarding the Polymer Dispersing Agent (D)

The polymer dispersing agent (D) according to the second embodiment is similar to the polymer dispersing agent (D) as mentioned in the first embodiment.

Moreover, a weight ratio of (D/P) between the polymer dispersing agent (D) coating the surface of the fine particle (P) and the fine particles (P) in such the dispersion is between 0.001 and 10. In a case where a rate of the polymer dispersing agent (D) is less than the above mentioned range, there may be a case that it is not able to obtain an effect sufficiently to suppress the agglomeration of the fine particles with each other and then the particles may become macroaggregated, or that the particles may gather to form a rigid aggregate due to the cross-linking effect. Meanwhile, in a case where the ratio is more than the above mentioned range, there may be a case that excessive polymer dispersing agent (D) may prevent from sintering the fine particle of the metal at the periods of drying and baking after coating the fine particle dispersion, and then a dense property as the layer quality may become decreased thereby, and that a residual substance after baking of the polymer dispersing agent (D) may remain in a metal coating inside, and then an electrical conductivity thereof may become decreased thereby.

Further, it is further preferable for the above mentioned ratio of the additive amount to be as between 0.5 and 10. Furthermore, it is able to use the polymer dispersing agent (D) with mixing not less than two types as well.

(3) Regarding the Production of the Fine Particle (P) Coated with the Polymer Dispersing Agent (D) by the Liquid Phase Reduction It is able to provide methods including Processes 1 and 2 as described below as preferred examples for producing the fine particle (P) coated with the polymer dispersing agent (D) by the liquid phase reduction.

(a) Process 1:

reducing at least one type of a metal ion by an electrolytic reduction or an electroless reduction using a reducing agent in an aqueous solution wherein such the metal ion and a polymer dispersing agent (D) are dissolved according to a liquid phase reduction; and forming thereby a fine particle dispersion aqueous solution in which fine particles (P) comprised of one type or not less than two types of the metal, the alloy, and the metallic compound, having the mean particle diameter of between 1 nm and 150 nm for the primary particles thereof and dispersed with being coated by such the polymer dispersing agent (D).

(b) Process 2:

Separating and collecting the fine particle (P) coated with the polymer dispersing agent (D) from the aqueous solution obtained at Process 1 wherein the fine particles (P) are dispersed.

(a) Regarding Process 1

A metal for a metal ion to be possible to use at Process 1 is the ion of the metal as similar to that exemplary mentioned in the first embodiment. Moreover, a ratio thereof for the polymer dispersing agent (D) is similar to that as mentioned in the second embodiment.

Regarding the above mentioned liquid phase reduction, it is able to adopt either one of the electrolytic reduction or the electroless reduction as far as it is able to form the fine particle (P) having the mean particle diameter of between 1 nm and 150 nm for the primary particles thereof, and it is able to adopt a heretofore known method regarding a method for such the electrolytic reduction and the electroless reduction. Further, the used metal ion exists with being dispersed in the aqueous solution as the fine particle (P) comprised of one type or not less than two types of the metal, the alloy, and the metallic compound, that are liquid phase reduced and coated with the polymer dispersing agent (D). Still further, the above mentioned metal, the alloy and the metallic compound are similar to the metal, the alloy and the metallic compound as mentioned in the first embodiment.

Still further, it is desirable for an adding amount of the polymer dispersing agent (D) to be as between 1 and 5,000 weight unit for the fine particles (P) of such the metal or the like as 100 weight unit, though it depends on a concentration of the fine particle (P) of the metal or the like produced from the reductive reaction aqueous solution, and then it is more preferable to be as between 5 and 1,000 weight unit. The reason is that there is a case where it is not able to obtain sufficiently an effect to suppress the agglomeration in a case where the adding amount of the polymer dispersing agent (D) is less than the above mentioned weight unit of one. Meanwhile, in a case where it is more than the above mentioned weight unit of 5000, there is a case where the excessive polymer dispersing agent may prevent from sintering the fine particle (P) of the metal or the like, or an electrical conductivity thereof may be decreased, in a case of forming a thin film, a thin wire, or the like, having an electrical conductivity by baking the fine particle dispersion according to the present invention.

Still further, as preferred examples for the reducing agent to be used in a case of the electroless reduction, it is able to provide such as sodium borohydride, hydrazine, dimethylaminoborane, trimethylaminoborane, or the like. And then it is able to use together with not less than two types therefrom as well. And then by the heretofore known liquid phase reduction using the above mentioned reducing agent, the fine particle (P) is formed, wherein the surface thereof is coated with the polymer dispersing agent (D).

Furthermore, in a case of the electrolytic reduction, the fine particle (P) is formed, which is coated with the polymer dispersing agent (D), in the vicinity of a cathode by applying an electric potential between an anode and the cathode provided in an aqueous solution containing a metal ion.

The mean particle diameter of the primary particles for the fine particle (P) produced by the above mentioned liquid phase reduction of the ion of the metal is between 1 nm and 150 nm. However, it is possible to form fine particles (P) having the mean particle diameter of between 2 nm and 20 nm for all practical purposes.

Here, the mean particle diameter of the primary particles means a diameter of the primary particle for individual fine particles of metal or the like comprising a secondary particle. It is able to measure such the primary particle diameter using an electron microscope. Moreover, the mean particle diameter means a number-average particle diameter of the primary particles. And then the mean particle diameter of the primary particles for the fine particle (P) is between 1 nm and 150 nm, however, it is preferable to use fine particles (P) having the diameter of between 1 nm and 100 nm from a viewpoint for all practical purposes, such as manufacturing, handling, or the like.

Furthermore, it is possible to perform a control of the mean particle diameter of the primary particles for the fine particle (P) by adjusting a type and a mixing concentration of the metal ion, polymer dispersing agent (D) and the reducing agent, and by adjusting such as an agitation speed, a temperature, a time, a pH, or the like, in a case of reductive reacting the metal ion. More specifically, in a case of electroless liquid phase reduction for example, it is possible to obtain fine particles of copper having a mean particle diameter of the primary particles as 100 nm in a case of reducing a metal ion (a cupric acetate or the like) using the sodium borohydride under the existence of polyvinylpyrrolidone (PVP, the number-average molecular weight of 3,500 approximately) at a reduction temperature of approximately 80° C. in an aqueous solution.

(b) Regarding Process 2

Process 2 is a process for separating and collecting a fine particle (P) from the aqueous solution obtained at the above mentioned Process 1, wherein the fine particle (P) is dispersed. For example, it is able to separate and collect the fine particle (P) coated with the polymer dispersing agent (D) from the aqueous solution, by adding an oxidizer to agglomerate or precipitate such the fine particle (P) as a secondary particle. Moreover, it is able to exemplary mention regarding the above mentioned oxidizer, such as an oxygen gas, a hydrogen peroxide, a nitric acid, or the like.

According to the addition of the above mentioned oxidizer, the dispersing action of the polymer dispersing agent (D) becomes reduced, there becomes progressed a secondary agglomeration of the primary fine particle (P) in the aqueous solution, and then it becomes to be an aggregate or a precipitate. Here in such the case, it is estimated that the polymer dispersing agent (D) exists with like coating a surface of the secondary agglomerated particle, and that there are not a lot of desorption of the polymer dispersing agent (D) from the surface of the fine particle (P).

Moreover, the above mentioned aggregate or the precipitate is filtrated and then collected by performing an operation of such as a centrifugal separation or the like. Further, in a case where it is required to remove an impurity, such as a case of using the reducing agent in the liquid phase reduction or the like, it is able to obtain the fine particle (P), a surface of which is coated with the polymer dispersing agent (D), by performing a cleaning using water or an alcohol for removing the impurity under a condition where it is hard for the polymer dispersing agent (D) to be removed therefrom.

Thus, it becomes able to obtain the fine particle (P) in such a way, wherein the mean particle diameter of the primary particles therefor is between 1 nm and 150 nm, and at least the part of the surface of the fine particle (P) as secondary agglomerated is coated with the polymer dispersing agent (D).

Still further, regarding the amount of the polymer dispersing agent (D) coating the surface of the fine particle (P) in such the dispersion, it is required to be as between 0.001 and 10 as the weight ratio of (D/P) for the fine particle (P) after dispersing the fine particle (P) into the mixed organic solvent or the like. Furthermore, it is possible for the above mentioned weight ratio of (D/P) to be as between 0.001 and 10 by performing the above mentioned operation in the case where the fine particle (P) is dispersed into the mixed organic solvent or the like, and then the fine particles (P) are preferably dispersed into the mixed organic solvent or the like.

(4) Regarding the Dispersion of the Fine Particles (P) into the Mixed Organic Solvent or the Like Here is provided a process to: re-disperse the fine particle (P), which is comprised of the above mentioned one type or not less than two types of the metal, the alloy, and the metallic compound, wherein at least the part of the surface thereof is coated with the polymer dispersing agent (D), into the mixed organic solvent (S1), the mixed organic solvent (S2), or the mixed organic solvent (S3); and to obtain the fine particle dispersion wherein such the fine particles (P) are dispersed into such the mixed organic solvent.

According to the second embodiment, a solvent type and a mixing rate thereof to be used individually for the mixed organic solvent (S1), the mixed organic solvent (S2) and the mixed organic solvent (S3) is similar to that as described in the first embodiment.

Moreover, regarding a method for re-dispersing the above mentioned fine particle (P) into the mixed organic solvent, it is able to adopt the heretofore known agitating method, and then it is desirable to adopt the method of irradiating the ultrasonic wave.

Further, there is no limitation in particular regarding a time period for the above mentioned irradiation of the ultrasonic wave, and it is possible to select arbitrarily. For example, there is a tendency that the longer the irradiation time period, the smaller the mean secondary agglomerated size thereof becomes, in a case of setting arbitrarily the time period of irradiating the ultrasonic wave as between five minutes and sixty minutes.

(5) Regarding the Fine Particle Dispersion

The re-dispersed fine particle dispersion as above described is to be stored till using thereof after being produced. And, such the fine particle dispersion according to the present invention is characterized in that it is superior in storage stability.

It is able to perform to evaluate the weight ratio of (D/P) between the polymer dispersing agent (D) coating the surface of the fine particle (P) and the fine particle (P) in the fine particle dispersion, by using the following method of (a) or (b) for example.

(a) Collecting the fine particle dispersion; separating the fine particle (P) from the fine particle dispersion by performing an operation of such as the centrifugal separation or the like; performing a preparation of a solution wherein a copper particle is dissolved under a condition for the polymer dispersing agent (D) as not to be reacted in an oxidizing solution; performing a quantitative analysis for the polymer dispersing agent (D) in such the solution by using the liquid chromatography or the like; and then measuring the weight ratio of (D/P). Here, it is possible to obtain approximately 0.02% by weight regarding the limit of detection for the polymer dispersing agent (D) by such the analysis method. Moreover, it is able to perform an analysis for the metals by using the heretofore known method.

(b) Collecting the fine particle dispersion; separating the fine particle (P) from the fine particle dispersion by performing an operation of such as the centrifugal separation or the like; extracting the polymer dispersing agent (D) from the fine particles (P) into the solvent by performing an operation of such as the solvent extraction or the like; and performing an operation of a concentration of such as the evaporation or the like therefor in a case of being required. And then it is possible to perform thereafter using an analysis, such as the liquid chromatography, the X-ray photoelectron spectroscopy (XPS), the Auger electron spectroscopy (AES), or the like, for a specific element (nitrogen, sulfur, or the like) in the polymer dispersing agent (D).

Moreover, it is possible to arrange such the obtained fine particle dispersion on a substrate, wherein the fine particles (P), the mean particle diameter for the primary particles of which is between 1 nm and 150 nm, are dispersed into the mixed organic solvent (S1), the mixed organic solvent (S2), or the mixed organic solvent (S3), by using the ink-jet method at a relatively lower temperature of approximately 200° C. for example, without using any reducing gas, such as a hydrogen gas or the like. And then it is possible to form a thin film containing metal or a thin wire containing metal, that have electrical conductivities, by baking therefor after drying it.

Further, there is no limitation in particular regarding the above mentioned substrate, and then it is able to use a glass, a polyimide, or the like. Still further, the drying and the baking are to be performed under an inert gaseous atmosphere, such as argon or the like. Still further, a drying condition is approximately for between fifteen minutes and thirty minutes at between 100° C. and 200° C. for example, which depends of course a polar solvent to be used. Still further, a baking condition is approximately for between twenty minutes and forty minutes at between 190° C. and 250° C. for example, which depends of course a coating thickness to be applied, and preferably for between twenty minutes and forty minutes approximately at between 190° C. and 220° C.

Still further, the thin film containing metal or the thin wire containing metal obtained in such a way have the electrical conductivities. And then it is possible to achieve a value of electrical resistance therefor as not higher than 1.0 Ωcm, for example to be between $1.0 \times 10^{-5}$ Ωcm and $1.0 \times 10^{-4}$ Ωcm. Furthermore, the above mentioned thin film containing metal is superior in substrate adherence as well.

EXAMPLES

The present invention will be described in detail below with using the examples, however, the present invention is not limited to the methods as described in the following examples.

Here, the mean particle diameter of the primary particles in the fine particle dispersion is evaluated by an observation using a transmission electron microscope (produced by JEOL Ltd., model: JEM-3010), and the secondary agglomerated size thereof is evaluated by the grain size distribution measurement using a grain size distribution measurement equipment of a dynamic light scattering type (produced by Sysmex Corporation, model: (Zetasizer Nano Series) Nano-ZS), regarding the below described examples and the comparative examples.

Example 1

Comparative Example 1

There are performed evaluations as described below regarding the mean particle diameter of the primary particles for the fine particle dispersion of copper, and regarding the dispersibility thereof.

(1) Regarding the Preparation of the Fine Particle of Copper

First, a fine particle of copper, a surface of which is coated with a polymer dispersing agent, is prepared using the following method.

As a material for a fine particle of copper, cupric acetate aqueous solution as 10 ml is prepared, wherein cupric acetate ($(CH_3COO)_2Cu \cdot 1H_2O$) as 0.2 g is dissolved in an aqua distillata as 10 ml. And, as a reducing agent for a metal ion, a sodium borohydride aqueous solution as 100 ml is prepared, wherein sodium borohydride is dissolved in an aqua distillata to be a concentration as 5.0 mol/liter (l). Moreover, as a polymer dispersing agent, polyvinylpyrrolidone (PVP, the number-average molecular weight of 3,500 approximately) is further added as 0.5 g into such the sodium borohydride aqueous solution, and then it is dissolved by agitating therefor.

Further, 10 ml of the above mentioned cupric acetate aqueous solution is dropped into the aqueous solution in a nitrogen gaseous atmosphere, wherein the above mentioned reducing agent and the polymer dispersing agent are dissolved therein. Then, the mixed solution is reacted with being agitated very well for approximately sixty minutes. As a result, the fine particle dispersion is obtained, wherein the fine particles of copper having the particle diameter of between 5 nm and 10 nm are dispersed in the aqueous solution. Next, oxygen gas is blown into 100 ml of the fine particle dispersion obtained by the above mentioned method in which the fine particles of copper are dispersed, and then it is put into a container made of glass to be still stood for 24 hours at a room temperature. Hence, it becomes able to obtain an aqueous solution in which the fine particles of copper are precipitated. Next, such the aqueous solution is put into a centrifugal separator, and then the fine particles of copper are collected therefrom. Next, the collected fine particles and 30 ml of an aqua distillata are put into a test tube, and then it is agitated very well using the ultrasonic homogenizer. Next, it is washed one time by performing a cleaning operation for collecting a particle component using the centrifugal separator. Thus, it becomes able to obtain the fine particle of copper, a surface of which is coated with the polymer dispersing agent.

Next, the fine particles of copper collected according to such the above mentioned processes are dispersed into 10 ml of individual solvents as one example of the mixed organic solvent according to the present invention, wherein N-methylacetamide as the organic solvent (A), diethyl ether as the organic solvent (B), and ethylene glycol as the organic solvent (C) are mixed with a ratio by volume of 90:10:0, 60:40:0, 90:0:10, 60:0:40, 90:5:5, 70:15:15, 60:20:20, 60:10:30, and 50:20:30, respectively. And then the fine particle dispersions according to the present invention are obtained by applying an ultrasonic wave vibration for approximately one hour into the individual dispersions using an ultrasonic homogenizer, respectively. Moreover, fine particle dispersions as Comparative examples are obtained, wherein the similar fine particles of copper are dispersed into mixed solvents having a ratio by volume of 20:0:80, 20:40:40 and 0:0:100 for the above mentioned organic solvents (A), (B) and (C), respectively.

(2) An Assay Regarding the Storage Stability of the Fine Particle Dispersion of Copper The mean particle diameter of the individual primary particles is measured immediately after the preparation of the individual fine particle dispersions of copper obtained according to the above description, using the above mentioned transmission electron microscope. Moreover, such the individual fine particle dispersions is retained at a room temperature (20° C. approximately) for a predetermined time period as shown in Table 1 respectively, and then the secondary agglomerated size for such the individual fine particles is measured respectively, using the above mentioned grain size distribution measurement equipment of a dynamic light scattering type. These results are shown in Tables 1 and 2. As a result, according to Examples 1-1 to 9, it is confirmed that it becomes able to obtain the fine particle dispersion having an extremely high storage stability by dispersing the fine particles of copper into the mixed organic solvent comprised of the organic solvent (A), the organic solvent (B) and the organic solvent (C) according to the present invention. On the contrary, according to Comparative examples 1-1 to 3, it is obvious that the storage stability thereof is relatively inferior thereto.

TABLE 1

|  |  | Example number | | | | | |
| --- | --- | --- | --- | --- | --- | --- | --- |
|  |  | 1-1 | 1-2 | 1-3 | 1-4 | 1-5 | 1-6 |
| (1) Solvent mixing ratio |  |  |  |  |  |  |  |
| N-methylacetamide | (% by volume) | 90 | 60 | 90 | 60 | 90 | 70 |
| Diethyl ether | (% by volume) | 10 | 40 | 0 | 0 | 5 | 15 |
| Ethylene glycol | (% by volume) | 0 | 0 | 10 | 40 | 5 | 15 |
| (2) Evaluation result |  |  |  |  |  |  |  |
| Mean particle diameter of primary particles Mean secondary agglomerated size | (nm) | 15 | 20 | 15 | 20 | 15 | 15 |
| Immediately after preparation | (nm) | 110 | 130 | 120 | 125 | 105 | 125 |
| Holding time: 24 hours | (nm) | 115 | 130 | 120 | 130 | 110 | 130 |
| Holding time: 2 days | (nm) | 115 | 135 | 125 | 130 | 110 | 130 |
| Holding time: 7 days | (nm) | 125 | 140 | 125 | 135 | 115 | 130 |

TABLE 2

|  |  | Example number | | | Comparative example number | | |
| --- | --- | --- | --- | --- | --- | --- | --- |
|  |  | 1-7 | 1-8 | 1-9 | 1-1 | 1-2 | 1-3 |
| (1) Solvent mixing ratio |  |  |  |  |  |  |  |
| N-methylacetamide | (% by volume) | 60 | 60 | 50 | 20 | 20 | 0 |
| Diethyl ether | (% by volume) | 20 | 10 | 20 | 0 | 40 | 0 |
| Ethylene glycol | (% by volume) | 20 | 30 | 30 | 80 | 40 | 100 |

TABLE 2-continued

|  |  | Example number | | | Comparative example number | | |
|---|---|---|---|---|---|---|---|
|  |  | 1-7 | 1-8 | 1-9 | 1-1 | 1-2 | 1-3 |
| (2) Evaluation result | | | | | | | |
| Mean particle diameter of primary particles | (nm) | 15 | 15 | 20 | 20 | 20 | 20 |
| Mean secondary agglomerated size | | | | | | | |
| Immediately after preparation | (nm) | 115 | 110 | 115 | 120 | 160 | 155 |
| Holding time: 24 hours | (nm) | 115 | 120 | 125 | 180 | 305 | 210 |
| Holding time: 2 days | (nm) | 115 | 125 | 130 | 265 | 420 | 290 |
| Holding time: 7 days | (nm) | 120 | 125 | 135 | 310 | 480 | 345 |

Example 2

Comparative Example 2

An evaluation of an electrical conductivity is performed as the below description regarding the baked layer formed by baking the fine particle dispersion.

First, the fine particle dispersions of Examples 2-1 to 9 are prepared, wherein the fine particle dispersion of copper prepared using the method as similar to that described in Example 1 is dispersed into 10 ml of a mixed solvent in which N-methylacetamide as the organic solvent (A) according to the present invention, diethyl ether as the organic solvent (B), and an ethylene glycol as the organic solvent (C) are mixed with a ratio by volume of 90:10:0, 60:40:0, 90:0:10, 60:0:40, 90:5:5, 70:15:15, 60:20:20, 60:10:30, and 50:20:30, respectively. A fine particle dispersion is prepared as Comparative example 2, wherein the copper nano particle dispersion produced by ULVAC Inc. (the product name: Cu Nano-Metal-Ink [CuIT]). Next, the above mentioned each of the fine particle dispersions is coated on individual glass substrates (size: 2 cm×2 cm), and then it is dried for approximately thirty minutes in a nitrogen atmosphere at a temperature of 140° C. Moreover, individual baked layers are obtained by performing a heat treatment for approximately one hour in a nitrogen atmosphere at a temperature of 180° C., 210° C., 250° C., 280° C. and 300° C. respectively. Further, for the obtained individual baked layers, an electrical resistance thereof is measured using a direct current four-terminal method respectively (the used measurement device: the digital multimeter DMM2000 type (the four-terminal electrical resistance measurement mode) produced by Keithley Instruments, KK).

The measurement results are shown in Table 3 and 4. According to Table 3 and 4, it becomes able to use the fine particle dispersion of copper obtained according to Examples 2-1 to 9 to be as the baked layer having the excellent electrical conductivity by performing the heat treatment at the temperature of not less than 250° C. in the nitrogen atmosphere after coating onto the glass substrate and drying therefor. On the contrary, the baked layer obtained according to Comparative example 2 is insulative.

TABLE 3

|  |  | Example number | | | |
|---|---|---|---|---|---|
|  |  | 2-1 | 2-2 | 2-3 | 2-4 |
| (1) Solvent mixing ratio | | | | | |
| N-methylacetamide | (% by volume) | 90 | 60 | 90 | 60 |
| Diethyl ether | (% by volume) | 10 | 40 | 0 | 0 |
| Ethylene glycol | (% by volume) | 0 | 0 | 10 | 40 |
| (2) Evaluation result (electrical resistance) | | | | | |
| Sintering temperature: 180° C. | ($\Omega$cm) | insulative | insulative | insulative | insulative |
| Sintering temperature: 210° C. | ($\Omega$cm) | insulative | insulative | insulative | insulative |
| Sintering temperature: 250° C. | ($\Omega$cm) | $2.6 \times 10^{-3}$ | $3.4 \times 10^{-3}$ | $9.4 \times 10^{-4}$ | $6.1 \times 10^{-4}$ |
| Sintering temperature: 280° C. | ($\Omega$cm) | $1.1 \times 10^{-3}$ | $1.7 \times 10^{-3}$ | $7.5 \times 10^{-4}$ | $1.8 \times 10^{-4}$ |
| Sintering temperature: 300° C. | ($\Omega$cm) | $7.9 \times 10^{-4}$ | $8.2 \times 10^{-4}$ | $3.8 \times 10^{-4}$ | $9.3 \times 10^{-5}$ |

* Insulative: not less than $1.0 \times 10^6$ ($\Omega$cm)

TABLE 4

|  |  | Example number | | |
|---|---|---|---|---|
|  |  | 2-5 | 2-6 | 2-7 |
| (1) Solvent mixing ratio | | | | |
| N-methylacetamide | (% by volume) | 90 | 70 | 60 |
| Diethyl ether | (% by volume) | 5 | 15 | 20 |
| Ethylene glycol | (% by volume) | 5 | 15 | 20 |

TABLE 4-continued

| (2) Evaluation result (electrical resistance) | | | | |
|---|---|---|---|---|
| Sintering temperature: 180° C. | (Ωcm) | insulative | insulative | insulative |
| Sintering temperature: 210° C. | (Ωcm) | insulative | insulative | insulative |
| Sintering temperature: 250° C. | (Ωcm) | $8.6 \times 10^{-4}$ | $5.2 \times 10^{-4}$ | $4.8 \times 10^{-4}$ |
| Sintering temperature: 280° C. | (Ωcm) | $6.7 \times 10^{-4}$ | $1.8 \times 10^{-4}$ | $1.5 \times 10^{-4}$ |
| Sintering temperature: 300° C. | (Ωcm) | $2.2 \times 10^{-4}$ | $8.9 \times 10^{-5}$ | $8.3 \times 10^{-5}$ |

| | | Example number | | Comparative example number |
|---|---|---|---|---|
| | | 2-8 | 2-9 | 2 |
| (1) Solvent mixing ratio | | | | |
| Ethylene glycol | (% by volume) | 60 | 50 | Copper nano particle produced by ULVAC, Inc. |
| N-methylacetamide | (% by volume) | 10 | 20 | |
| Diethyl ether | (% by volume) | 30 | 30 | |
| (2) Evaluation result (electrical resistance) | | | | |
| Sintering temperature: 180° C. | (Ωcm) | insulative | insulative | insulative |
| Sintering temperature: 210° C. | (Ωcm) | insulative | insulative | insulative |
| Sintering temperature: 250° C. | (Ωcm) | $4.3 \times 10^{-4}$ | $6.1 \times 10^{-4}$ | insulative |
| Sintering temperature: 280° C. | (Ωcm) | $1.1 \times 10^{-4}$ | $3.4 \times 10^{-4}$ | insulative |
| Sintering temperature: 300° C. | (Ωcm) | $7.8 \times 10^{-5}$ | $1.9 \times 10^{-4}$ | insulative |

* Insulative: not less than $1.0 \times 10^6$ (Ωcm)

Example 3

Comparative Example 3

An assay regarding the substrate adherence of the baked layer obtained using the fine particle dispersion is performed as described below.

First, the fine particle dispersions of Examples 3-1 to 6 are prepared, wherein the fine particle of copper prepared using the method as similar to that described in Example 1 is dispersed into 10 ml of a mixed solvent in which N-methylacetamide as the organic solvent (A) according to the present invention, diethyl ether as the organic solvent (B), and ethylene glycol as the organic solvent (C) are mixed with a ratio by volume of 90:10:0, 60:40:0, 90:0:10, 60:0:40, 90:5:5, 70:15:15, 60:20:20, 60:10:30, and 50:20:30, respectively. while, there is prepared fine particle dispersions as Comparative examples 3-1, 3-2 and 3-3, wherein the fine particle of copper is dispersed in the same manner into 10 ml of a mixed solvent in which the organic solvents (A), (B) and (C) are mixed with a ratio by volume of 98:2:0, 33.4:66.6:0, and 0:0:100, respectively. Next, the individual fine particle dispersion is coated on a glass substrate (size: 2 cm×2 cm) respectively, and then it is dried in a nitrogen atmosphere at a temperature of 140° C. Moreover, a baked layer is obtained by performing a heat treatment for approximately one hour in a nitrogen atmosphere at a temperature of 210° C. An then for the obtained individual baked layers, a peel-off test using a cross-cut tape is performed respectively (10×10 cross-cuts with a width of 1 mm respectively, the used tape: model number 631S #25, produced by TERAOKA SEISAKUSHO CO., LTD.).

These results are shown in Tables 5 and 6.

According to the results as shown in Table 5 and 6, there is no peel-off by tape observed for the baked layers (Examples 3-1 to 9), wherein the individual fine particle dispersions is dispersed into the mixed solvent according to the present invention respectively and then it is coated onto the glass substrate and baked. On the contrary, according to Comparative examples 3-1 to 3, there are observed the peel-off by tape or the peeling a part thereof by tape.

According to the above description, it is confirmed that the baked layer has a stronger substrate adherence, wherein the fine particle dispersion is dispersed into the mixed solvent according to the present invention and then it is coated onto the glass substrate and baked.

TABLE 5

| | | Example number | | | | | |
|---|---|---|---|---|---|---|---|
| | | 3-1 | 3-2 | 3-3 | 3-4 | 3-5 | 3-6 |
| (1) Solvent mixing ratio | | | | | | | |
| N-methylacetamide | (% by volume) | 90 | 60 | 90 | 60 | 90 | 70 |
| Diethyl ether | (% by volume) | 10 | 40 | 0 | 0 | 5 | 15 |
| Ethylene glycol | (% by volume) | 0 | 0 | 10 | 40 | 5 | 15 |
| (2) Evaluation result | | | | | | | |
| Stripping test result | | peel-off: none | peel-off: none | peel-off: none | peel-off: none | peel-off: none | peel-off: none |

TABLE 6

| | | Example number | | | Comparative example number | | |
|---|---|---|---|---|---|---|---|
| | | 3-7 | 3-8 | 3-9 | 3-1 | 3-2 | 3-3 |
| (1) Solvent mixing ratio | | | | | | | |
| N-methylacetamide | (% by volume) | 60 | 60 | 50 | 98 | 33.4 | 0 |
| Diethyl ether | (% by volume) | 20 | 10 | 20 | 2 | 66.6 | 0 |
| Ethylene glycol | (% by volume) | 20 | 30 | 30 | 0 | 0 | 100 |

TABLE 6-continued

| | Example number | | | Comparative example number | | |
|---|---|---|---|---|---|---|
| | 3-7 | 3-8 | 3-9 | 3-1 | 3-2 | 3-3 |
| (2) Evaluation result | | | | | | |
| Stripping test result | peel-off: none | peel-off: none | peel-off: none | peel-off: yes | peel-off: yes | peel-off: yes |

Example 4

An assay regarding the existence of the polymer dispersing agent in the fine particles of copper according to the present invention is performed as described below.

First, a fine particle component is collected by performing a centrifugal sedimentation using the centrifugal separator, that is coated with the polymer dispersing agent in the fine particle dispersion of copper, which is prepared by dispersing an N-methylacetamide as the organic solvent (A), a diethyl ether as the organic solvent (B), and an ethylene glycol as the organic solvent (C) with a ratio by volume of 90:5:5, according to the method as described in Example 1. Next, an eluent, which is prepared by mixing 0.2 M of a nitric acid aqueous solution, 0.2 M of a hydrochloric acid aqueous solution and a methanol with a ratio of 1:1:2, is put into the fine particles of copper obtained thereby, and then the copper particle component is dissolved therein. Next, the obtained solution is neutralized using a proper amount of a sodium hydroxide aqueous solution. Moreover, a content of the polymer component is examined using a gel permeation chromatography (GPC) produced by Showa Denko K.K., a detector: Shodex RI SE-61 and a column: Tosoh TSKgel G3000PWXL. As a result, there is found an obvious peak at a molecular region in the obtained spectrum data meaning the polymer component (the polyvinylpyrrolidone) which is used therefor. And then according to the result of the quantitative analysis for the peak intensity thereof, it is confirmed that the amount (D) of the polymer dispersing agent, which is attached to the fine particle of copper obtained using the present producing method, is 0.002 as the weight ratio of (D/P) for the amount (P) of the fine particles. Thus, it becomes able to confirm that the fine particle, of copper used in Examples 1 to 3 is coated with the polymer dispersing agent as water soluble.

INDUSTRIAL APPLICABILITY

According to the present invention, it becomes able to use widely the fine particle dispersion, wherein the fine particle of the metal or the like is dispersed into the organic solvent, for such as an ink-jet ink, an etching resist, a solder resist, a dielectric substance pattern, an electrode (electrically conductive circuit) pattern, a wiring pattern in an electronic component, an electrically conductive paste, an electrically conductive ink, an electrically conductive film, or the like.

What is claimed is:

1. A fine particle dispersion, in which a fine particle (P) comprised of one type or not less than two types of a metal, an alloy, and/or a metallic compound, having a mean particle diameter between 1 nm and 150 nm for primary particles thereof, and having a surface at least a part thereof coated with a polymer dispersing agent (D), is dispersed in a mixed organic solvent, wherein a weight ratio of (D/P) between the polymer dispersing agent (D) coating the surface of the fine particle (P) and the fine particle (P) in the dispersion is between 0.001 and 10, the mixed organic solvent is one of:

(i) a mixed organic solvent (S1) which contains at least an organic solvent (A) having an amide group as between 50% and 95% by volume, and a low boiling point organic solvent (B) having a boiling point between 20° C. and 100° C. at a normal pressure as between 5% and 50% by volume;

(ii) a mixed organic solvent (S2) which contains at least the organic solvent (A) having the amide group as between 50% and 95% by volume, and an organic solvent (C) having a boiling point higher than 100° C. at the normal pressure and comprised of an alcohol and/or a polyhydric alcohol having one or not less than two hydroxyl groups in a molecule thereof as between 5% and 50% by volume; or (iii) a mixed organic solvent (S3) which contains at least the organic solvent (A) having the amide group as between 50% and 94% by volume, the low boiling point organic solvent (B) having the boiling point between 20° C. and 100° C. at the normal pressure as between 5% and 49% by volume, and the organic solvent (C) having the boiling point of higher than 100° C. at the normal pressure and comprised of the alcohol and/or the polyhydric alcohol having the one or not less than the two hydroxyl groups in the molecule thereof as between 1% and 45% by volume, and the organic solvent (A) is one type or not less than two types selected from N-methylacetamide, N-methylformamide, and N-methylpropanamide.

2. The fine particle dispersion according to claim 1, wherein the organic solvent (B) is one type or not less than two types selected from an ether based compound (B1) expressed by a general form $R^1$—O—$R^2$ ($R^1$ and $R^2$ are alkyl groups individually having a carbon number between one and four respectively), an alcohol (B2) expressed by a general form $R^3$—OH ($R^3$ is an alkyl group having a carbon number between one and four), a ketone based compound (B3) expressed by a general form $R^4$—C(=O)—$R^5$ ($R^4$ and $R^5$ are alkyl groups individually having a carbon number one or two respectively), and an amine based compound (B4) expressed by a general form $R^6$—(N—$R^7$)—$R^6$ ($R^6$, $R^7$ and $R^8$ are alkyl groups individually having a carbon number between zero and two respectively or a hydrogen atom).

3. The fine particle dispersion according to claim 1, wherein the organic solvent (B) is one of: the ether based compound (B1) of one type or not less than two types selected from diethyl ether, methyl propyl ether, dipropyl ether, diisopropyl ether, methyl-t-butyl ether, t-amyl methyl ether, divinyl ether, ethyl vinyl ether, and aryl ether;

the alcohol (B2) of one type or not less than two types selected from methanol, ethanol, 1-propanol, 2-propanol, 2-butanol, and 2-methyl 2-propanol;

the ketone based compound (B3) of one type or not less than two types selected from acetone, methyl ethyl ketone, and diethyl ketone; or the amine based compound (B4) as triethylamine and/or diethylamine.

4. The fine particle dispersion according to claim 1, wherein the organic solvent (C) is one type or not less than two types selected from ethylene glycol, diethylene glycol, 1,2-propanediol, 1,3-propanediol, 1,2-butanediol, 1,3-butanediol, 1,4-butanediol, 2-butene-1,4-diol, 2,3-butanediol, pentanediol, hexanediol, octanediol, glycerol, 1,1,1-trishydroxymethylethane, 2-ethyl-2-hydroxymethyl-1,3-propanediol, 1,2,6-hexanetriol, 1,2,3-hexanetriol, 1,2,4-butanetriol, threitol, erythritol, pentaerythritol, pentitol, and hexitol.

5. The fine particle dispersion according to claim 1, wherein the polymer dispersing agent (D) is one type or not less than two types selected from polyvinylpyrrolidone, polyethyleneimine, polyacrylic acid, carboxymethylcellulose, polyacrylamide, polyvinyl alcohol, polyethylene oxide, starch, and gelatin.

6. The fine particle dispersion according to claim 1, wherein the metal is one type or not less than two types selected from copper, silver, gold, nickel, cobalt, iron, zinc, tin, aluminum, bismuth, platinum, rhodium, palladium, ruthenium, manganese, chromium, vanadium, and titanium, the alloy is an alloy comprised of not less than two types of the metals, and the metallic compound is an oxide of the metal and the alloy.

\* \* \* \* \*